(12) United States Patent
Ott et al.

(10) Patent No.: US 6,646,457 B2
(45) Date of Patent: Nov. 11, 2003

(54) TEST NEEDLE FOR PATTERN ADAPTER OF CIRCUIT BOARD TESTER

(75) Inventors: Bernd Ott, Gaildorf (DE); Manfred Prokopp, Wertheim-Reicholzheim (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

(21) Appl. No.: 10/080,021

(22) Filed: Feb. 21, 2002

(65) Prior Publication Data

US 2002/0158644 A1 Oct. 31, 2002

Related U.S. Application Data

(63) Continuation of application No. PCT/EP00/07793, filed on Aug. 10, 2000.

(30) Foreign Application Priority Data

Aug. 23, 1999 (DE) .......................................... 199 39 955

(51) Int. Cl.[7] .............................................. G01R 31/02
(52) U.S. Cl. ...................................... 324/754; 324/761
(58) Field of Search ................................ 324/754, 761, 324/762, 765, 758, 72.5; 439/169, 174, 482, 912

(56) References Cited

U.S. PATENT DOCUMENTS

| | | | |
|---|---|---|---|
| 4,403,822 A | | 9/1983 | Smith .......................... 339/108 |
| 4,816,754 A | * | 3/1989 | Buechele et al. ............ 324/761 |
| 4,896,107 A | | 1/1990 | Maelzer et al. ............ 324/158 P |
| 4,899,104 A | | 2/1990 | Maelzer et al. ............ 324/158 F |
| 5,134,364 A | * | 7/1992 | Karpman et al. ........... 324/72.5 |
| 5,378,971 A | * | 1/1995 | Yamashita .................. 324/72.5 |
| 5,500,607 A | * | 3/1996 | Verkuil ....................... 324/754 |
| 6,366,106 B1 | * | 4/2002 | Kimori et al. .............. 324/754 |

FOREIGN PATENT DOCUMENTS

| | | | |
|---|---|---|---|
| DE | 36 20 947 A1 | 1/1988 | ........... H01R/11/18 |
| DE | 36 39 360 A1 | 5/1988 | ........... H01R/23/72 |
| DE | 37 36 689 A1 | 5/1988 | ........... G01R/31/28 |
| DE | 91 00 432.2 U1 | 5/1991 | ........... H01R/11/18 |
| DE | 43 23 276 A1 | 1/1995 | ........... G01R/31/28 |
| DE | 44 17 811 A1 | 11/1995 | ........... G01R/31/28 |
| DE | 44 39 758 A1 | 5/1996 | ........... G01R/1/067 |
| DE | 296 16 272 U1 | 3/1998 | ........... G01R/31/28 |
| DE | 196 54 404 A1 | 6/1998 | ........ G01R/31/304 |
| DE | 298 10 384 U1 | 11/1998 | ............. G06F/1/16 |
| DE | 44 39 758 C2 | 4/1999 | ........... H01R/11/18 |
| EP | 0 222 036 B1 | 2/1989 | ........... G01R/1/073 |
| EP | 0 495 380 A2 | 1/1992 | ........... G01R/1/067 |

* cited by examiner

Primary Examiner—Kamand Cuneo
Assistant Examiner—Minh N. Tang
(74) Attorney, Agent, or Firm—Houston Eliseeva LLP

(57) ABSTRACT

The test needle has, for contacting a circuit board test point, a contact portion configured conically tapered to a free contact tip. The contact portion has a length of at least 15 mm and at the contact tip a diameter smaller than 0.2 mm. An end section of the contact portion apposite the contact tip comprises a diameter at least 0.1 mm larger than the contact tip. With the test needle in accordance with the invention, extremely dense structures on circuit boards can be strobed. The test needle in accordance with the invention is stiffer than known test needles for strobing comparable structures. This simplifies their handling and the configuration of a pattern adapter incorporating these test needles.

26 Claims, 1 Drawing Sheet

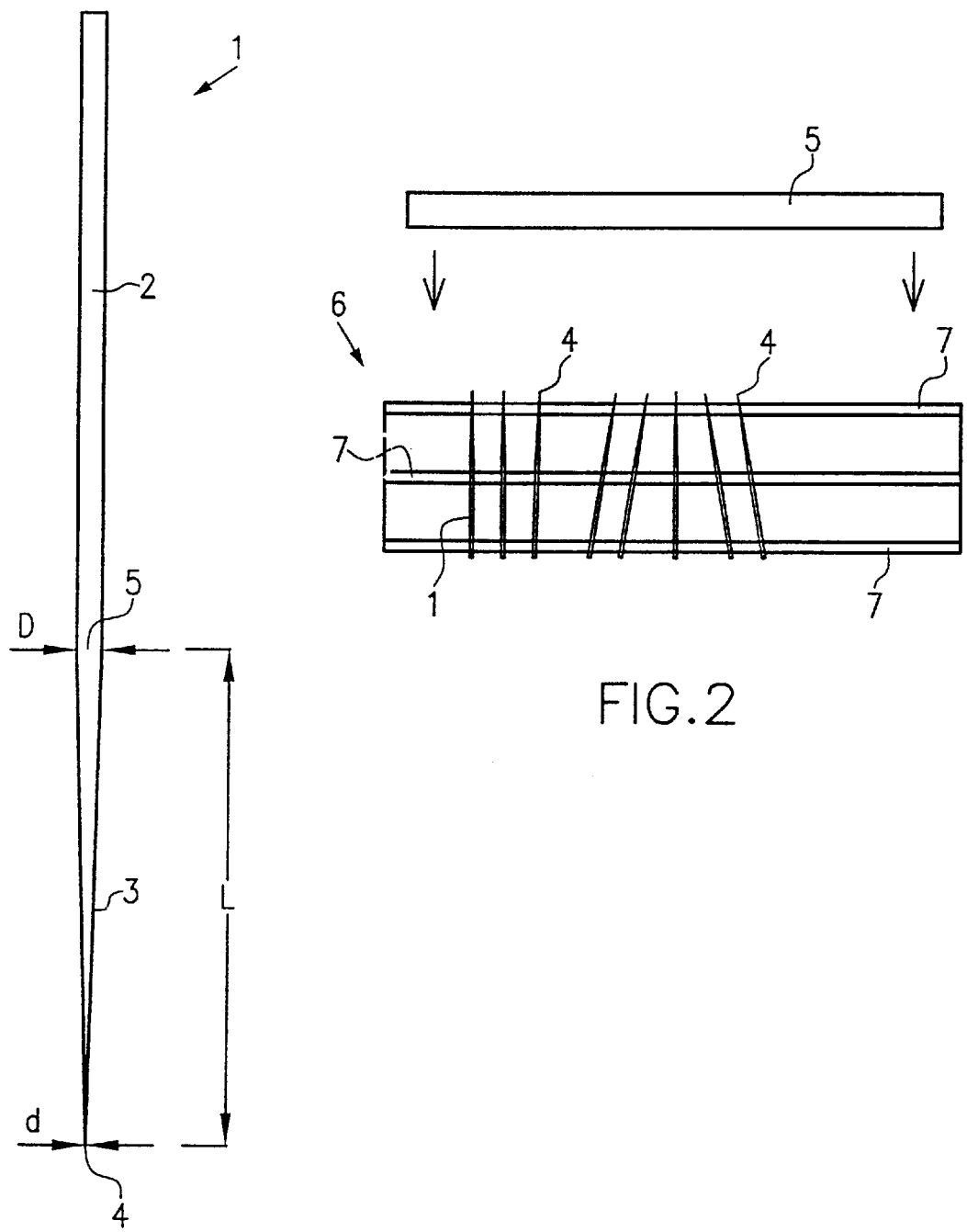

TEST NEEDLE FOR PATTERN ADAPTER OF CIRCUIT BOARD TESTER

This is a continuation of International Application PCT/EP00/07793, filed on Aug. 10, 2000, which was published in German under PCT Article 21(2), the contents of which are incorporated herein by this reference.

BACKGROUND OF THE INVENTION

Pattern adapters for circuit board tester are used to convert a predetermined regular grid pattern of a tester into the usually irregular test point arrangement of a circuit board to be tested. The pattern adapter comprises, as a rule, several guide boards spaced away from each other including guide holes for receiving test needles. The test needles are arranged canted in the adapter so that they can electrically connect the contact points of the regular grid pattern to the circuit board test points since these, as a rule, deviate from the regular arrangement of the grid pattern.

The spacing of test points on the circuit boards is constantly decreasing. Currently, the spacing is a mere 0.3 mm (12 mil) or 0.25 mm (10 mil), for example. The test needles at the side of the adapter facing the test object need to be arranged on a correspondingly tight pitch.

This is why extremely thin test needles are used for such adapters. The test needles have a diameter of 0.1 mm or 0.2 mm, for example. These test needles are extremely delicate or unstable so that many guide boards are needed in the adapter to reliably ensure good guidance.

Also known are test needles that have differing diameters along their length with steplike transitions between individual portions of the needles. The portion of the test needle at the contact tip, which is to be contacted to a test point of the circuit board to be tested, has the smallest diameter. The needle's diameter then increases stepwise with increasing distance away from the contact tip. As compared to thin, constant-diameter test needles, these stepped test needles are substantially stiffer and can also be arranged with their contact tips located relatively close to each other. Nonetheless, the portion adjoining the contact tip is also very delicate or unstable so that it needs to be supported in the pattern adapter by several test boards.

German Utility Model DE 91 00 432 U1 concerns a test needle for an electric test adapter. The test needle is conically pointed at the free end, the tip comprising a spherical rounding with a radius of approx. 50 µm. This German Utility Model teaches that the radius of the spherical tip should be in the range of 20 to 80 µm.

German Utility Model DE 298 10 384 U1 concerns conically-pointed test needles with no indication of test needle thickness.

DE 37 36 689 A1 and DE 36 39 360 A1 describe probes having a conically pointed tip and a spherical head at the end remote from the test tip. The largest shank diameter of these needles is in the range of 1.3 to 1.4 mm and the diameter of the head is approx. 2 mm. No indication is given as to the diameter of the contact tip.

Probes are evident from DE 44 17 811 A1, which feature a very short conical tip for contacting a contact point.

DE 44 39 758 A1 discloses a probe for a test adapter, which again features a short and conical tip. The tip is produced by grinding. This reference citation shows an adapter including test needles arranged canted in part.

DE 36 20 947 A1 shows a test needle consisting of a constant cross-section wire, the diameter of which is less than 0.2 mm. Also shown is a further pointed test needle.

A pointed test needle is illustrated in U.S. Pat. No. 4,403,822 with no indication as to the thickness of this test needle.

DE 44 39 758 C2 describes probes made of a thin wire, which is 0.15 mm to 0.5 mm thick. These probes have a short tip.

DE 196 54 404 A1 proposed a complicated solution for testing circuit boards on a pitch spacing of 200 µm, in which an adapter including test needles is used to contact the contact points on a very tight pitch by means of a translator foil. This application makes it clear that there is no direct solution to contacting contact points on a tight pitch.

The use of smooth non-contoured music wire probes in an adapter is proposed in DE 43 23 276 A1. In this adapter a solid material body is penetrated by test needle passageways, in which the thin test needles are reliably guided. These test needles may have a diameter of up to 0.1 mm.

German Utility Model DE 296 16 272 U1 discloses an adapter having an internal adjustment mechanism.

SUMMARY OF THE INVENTION

The present invention concerns a test needle for a pattern adapter of a circuit board tester, which can be optimally configured so that it is highly stable and can achieve a tight pitch between the test tips of two adjacent test needles in a pattern adapter.

In general according to one aspect, the invention features a test needle for a pattern adapter of a circuit board tester. The test needle comprises a contact portion for contacting a circuit board test point, which portion is configured with a conical taper to a free contact tip. The contact portion has a length of at least 15 mm and at the contact tip a diameter smaller than 0.2 mm. An end section of the contact portion opposite the contact tip is in the range of 0.3 mm to 0.4 mm.

The contact portion, which is conically tapered to the contact tip, represents an optimum trade-off between very thin test needles suitable for contacting circuit board test points on a very tight pitch and thicker test needles having enhanced stability and thus are easier to guide in a pattern adapter, i.e. require fewer guide boards.

Since the cross-section of the test needle in accordance with the invention is widened in the portion before the contact tip, the contact portion is substantially stiffer than test needles having a contact tip where the diameter is the same as the diameter in the contact portion. This applies also in comparing stepped test needles as described above. The thinnest section of these stepped test needles comprises the contact tip, which is substantially more flexible than the contact portion of the test needle in accordance with the invention for the same diameter at the contact tip. It has been discovered that in an adapter having test needles in accordance with the invention the guide board, which is needed with an adapter having stepped test needles, can be eliminated.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1 is a magnified schematic plan view of a test needle in accordance with the invention; and FIG. 2 is a simplified schematic view of an adapter including test needles in accordance with the invention.

DETAILED DESCRIPTION OF THE PREFERRED EMBODIMENTS

FIG. 1 shows an exemplary embodiment of a test needle 1, which has been constructed according to the principles of the present invention.

Specifically, the test needle 1 comprises a base portion 2 and an adjoining contact portion 3. The base portion 2 is a rod-shaped or cylindrical section of circular cross-section and constant diameter D. The contact portion 3 is conical, being tapered to its free end so that it forms a contact tip 4 at its free end. The end section 5 of the contact portion 3 has the same diameter D as the base portion 2. The diameter d of the test needle at the contact tip 4 is smaller than or equal to 0.2 mm and is preferably about 0.1 mm so that the test points of a circuit board to be tested on a tight pitch can be contacted.

FIG. 2 illustrates how the test needles 1 are arranged in a pattern adapter 6 for testing a circuit board 5 to be tested and thus how a regular grid pattern of a tester is converted into the irregular arrangement of the circuit board test points by canting or angling the test needles 1 in the adapter 6.

More particularly, it is possible with such a pattern adapter 6 to test many circuit board test points on a tight pitch by a corresponding number of test needles 1 covering a major portion of the grid pattern. The test needles are directed to this portion of the circuit board test points having a tight pitch. Accordingly, these test needles 1 are focussed like a beam of light to the circuit board test points on a tight pitch.

The test needles 1 are held in the pattern adapter 6 by guide boards 7 spaced away from each other. Guide holes are drilled into the guide boards 7. The test needles 1 extend through is these guide holes.

The minimum spacing between the test needles 1 adjoining the contact tips 4 cannot be reduced arbitrarily since there arc limitations in how close together the guide holes can be drilled. Additionally, ridges materialize as a result of the hole drilling, which automatically results in a certain spacing. These restrictions need to be taken into account when defining the dimensions of the test needle in accordance with the invention. Furthermore, the grid pattern of the tester considerably influences the spatial arrangement of the test needles and, since there arc limits to earning and turning the test needles, there is a minimum spacing of the test tips since the test needles would otherwise come into contact with each other.

Due to the spatial arrangement of the test needles in the pattern adapter, it is not possible to provide relatively thick test needles having merely a small short tip since these test needles cannot be arranged on a tight pitch due to the correspondingly larger holes which must be drilled; and, in addition, there is the risk of the portions adjoining the contact tips coming into contact with each other. With the test needles in accordance with the invention, these problems are avoided by the contact portions being gradually, conically widened over a predetermined length L.

In testers for testing non-componented circuit boards use is made of the so-called single-density and double-density pattern. The single-density pattern is a ¹⁄₁₀th of an inch pattern having contact points pitched in accordance with a rectangular system of coordinates incorporating a contact point spacing in both coordinate directions of $a = \frac{1}{10}$th inch = 2.54 mm. The double-density pattern differs from the single-density pattern by it being superimposed by an identical further pattern of contact points displaced by 0.5 a relative to the starting pattern in the two coordinate directions. The double-density pattern is described in EP 0 222 036 B1.

By computer calculations the minimum length L of the contact portion 3 can be determined on the basis of the grid pattern, the diameter D in base portion 2, the diameter d at the contact tip 4, the total length of the test needle and the hole diameter for a given minimum spacing between two adjacent contact tips 4 of a pattern adapter.

Such example calculations are based on a test needle having a total length of approx. 95 mm and a contact tip with a diameter d equal to 0.1 mm. The hole diameter including a ridge resulting from drilling is 0.15 mm.

For these example calculations the following Table lists the minimum lengths L of the contact portion 3 for various thicknesses D (0.3 mm and 0.4 mm resp.) and various grid patterns of the tester for achieving a contact tip spacing of 0.3 mm (=12 mil), the single-density pattern SD and double-density pattern DD as described above as the grid pattern of the tester forming the basis of the example calculations.

In four of the example calculations, a pattern of 20×20 circuit board test points is provided additionally on the test object 5 which is moreover turned through 45 degrees relative to the grid pattern in two example calculations. Such close-pitched circuit board test points are achieved by means of so-called ball grid arrays on the circuit boards, these ball grid arrays representing portions of extremely high density of circuit board test points.

The example calculations were done by two methods M1, M2 relative to the arrangement of the test needles. Method M1 takes into account every cant of the test needles possible in theory, whereas method M2 assumes an optimum arrangement of the test needles. Such an optimum arrangement of the test needles is obtainable by means of special computer programs put to use in producing the pattern adapter. By optimizing the arrangement, the maximum cant of the test needles is reduced in the pattern adapter.

The example calculations indicated that, for a single-density pattern and a test needle having a thickness D of 0.3 mm, the length of the contact portion may be 15 mm. For the remaining example calculations, the minimum length of the contact portion 3 is equal to or greater than 20 mm. The longer the length of the contact portion, the less is the increase in the diameter from the contact tip 4 in the direction of the end section 5 of the contact portion 3. With the optimized method for arranging test needles M2, the maximum cant of the test needles is reduced, enabling the length L of the contact portion to be correspondingly reduced.

Table for Calculating L

| Grid pattern | Method D | L | Note |
|---|---|---|---|
| SD | M1 | 0.3 | 15 |
| DD | M1 | 0.3 | 20, 20 × 20 |
| DD | M2 | 0.3 | 20, 20 × 20 turned |
| DD | M2 | 0.3 | 30 |
| SD | M1 | 0.4 | 30 |
| DD | M1 | 0.4 | 40 |
| DD | M2 | 0.4 | 25, 20 × 20 |
| DD | M2 | 0.4 | 45, 20 × 20 turned |

For a diameter D of 0.3 mm of the test needle and a diameter of 0.1 mm at the contact tip an array of circuit board test points can be strobed with a length of 30 mm, each of which has a pitch of 0.3 mm, whereby the circuit board test points do not need to be aligned as compared to the grid pattern. This is why such a test needle satisfies the current requirements for testing arrays of tight-pitched circuit board test points. For a diameter D of 0.4 mm and a length of 45 mm of the contact portion, such arrays of circuit board test points can now be reliably strobed.

The above example calculations are based on parameters such as e.g. drill hole diameter and the total length of the test needle permitting a change in general and which depend on the nature of the pattern adapter. In addition, it is possible to make use of other methods of arranging the test needles in the adapter. The results of these example calculations can thus not be translated directly to all circuit board testers, they instead serving as a guideline in establishing the dimensions of the test needle in accordance with the invention and show that with the test needle in accordance with the invention extremely dense structures on a circuit board to be tested can now be strobed.

Since the test needles in accordance with the invention are conically widened from the contact tip 4 the test needle in accordance with the invention is substantially stiffer than test needles with which comparable structures can be strobed on a circuit board to be tested.

The test needle in accordance with the invention is made preferably in a two-step procedure, the test needle first being subjected to coarse shaping, for example by means of grinding, and then surface finished, for example by chemical milling. Surface finishing by chemical milling additionally results in surface hardening, as a result of which the strength of the test needle can be further enhanced. The test needle may also be produced by laser beam machining. With a laser the test needle may also be marked by surface oxidization, this permitting undercutting test needles of various types. Suitable materials for the test needles are steel or hard or hard-elastic alloys such as titanium alloy, nickel-titanium alloys or the like.

While this invention has been particularly shown and described with references to preferred embodiments thereof, it will be understood by those skilled in the art that various changes in form and details may be made therein without departing from the scope of the invention encompassed by the appended claims.

What is claimed is:

1. A test needle for a pattern adapter of a circuit board tester wherein the test needle comprises: a contact portion for contacting a circuit board test point, the contact portion being conically tapered to a free contact tip, said contact portion comprising:
a length of at least 15 mm;
a diameter at said contact tip that is smaller than 0.2 mm, and
a diameter at an end section of said contact portion opposite said contact tip in the range of 0.3 mm to 0.4 mm.

2. The test needle as set forth in claim 1, wherein said length (L) of said contact portion is at least 20 mm and said diameter (D) of said end section is at least 0.3 mm.

3. The test needle as set forth in claim 2, wherein the diameter (d) of said contact tip is smaller than or equal to 0.1 mm.

4. The test needle as set forth in claim 3, wherein said contact tip is rounded.

5. The test needle as set forth in claim 4, wherein adjoining said end section opposite said contact tip is a base portion of constant diameter.

6. The test needle as set forth in claim 5, wherein said base portion has a length of at least 30 mm.

7. The test needle as set forth in claim 6, wherein said test needle is made by coarse shaping and surface finishing.

8. The test needle as set forth in claim 7, wherein said coarse shaping is grinding and said surface finishing is chemical milling.

9. The test needle as set forth in claim 6, wherein said test needle is made by laser machining.

10. The test needle as set forth in claim 1, wherein said length of said contact portion is at least 30 mm and said diameter of said end section is at least 0.4 mm.

11. The test needle as set forth in claim 1 wherein the diameter of said contact tip is smaller than or equal to 0.1 mm.

12. The test needle as set forth in claim 1, wherein said contact tip is rounded.

13. The test needle as set forth in claim 1, wherein adjoining said end section opposite said contact tip is a base portion of constant diameter.

14. The test needle as set forth in claim 13, wherein said base portion has a length of at least 30 mm.

15. The test needle as set forth in claim 1, wherein said test needle is made by coarse shaping and surface finishing.

16. The test needle as set forth in claim 15, wherein said coarse shaping is grinding and said surface finishing is chemical milling.

17. The test needle as set forth in claim 1, wherein said test needle is made by laser machining.

18. A pattern adapter for a circuit board tester comprising guide boards arranged spaced away from each other incorporating guide holes for receiving test needles configured as set forth in claim 1, wherein at least some of said test needles are arranged canted relative to each other in said pattern adapter so that they arc closely spaced at their contact tips.

19. The pattern adapter as set forth in claim 18, wherein a spacing of adjoining contact tips is smaller than or equal to 0.3 mm.

20. A pattern adapter for a circuit board tester comprising guide boards arranged spaced away from each other incorporating guide holes for receiving test needles configured as set forth in claim 7, wherein at least some of said test needles are arranged canted relative to each other in said pattern adapter so that they are closely spaced at their contact tips.

21. The pattern adapter as set forth in claim 20, wherein a spacing of adjoining contact tips is smaller than or equal to 0.3 mm.

22. A pattern adapter for a circuit board tester comprising guide boards arranged spaced away from each other incorporating guide holes for receiving test needles configured as set forth in claim 9, wherein at least some of said test needles are arranged canted relative to each other in said pattern adapter so that they are closely spaced at their contact tips.

23. The pattern adapter as set forth in claim 22, wherein a spacing of adjoining contact tips is smaller than or equal to 0.3 mm.

24. The pattern adapter as set forth in claim 18, wherein a spacing of adjoining contact tips is smaller than or equal to 0.25 mm.

25. The pattern adapter as set forth in claim 20, wherein a spacing of adjoining contact tips is smaller than or equal to 0.25 mm.

26. The pattern adapter as set forth in claim 22, wherein a spacing of adjoining contact tips is smaller than or equal to 0.25 mm.

* * * * *

UNITED STATES PATENT AND TRADEMARK OFFICE
CERTIFICATE OF CORRECTION

PATENT NO. : 6,646,457 B2  Page 1 of 1
DATED : November 11, 2003
INVENTOR(S) : Bernd Ott and Manfred Prokopp It is certified that error appears in the above-identified patent and that said Letters Patent is hereby corrected as shown below:

Column 3,
Lines 48 and 55, delete "arc" and insert -- are --;
Line 55, delete "earning" and insert -- canting --.

Signed and Sealed this

Thirtieth Day of December, 2003

JAMES E. ROGAN
*Director of the United States Patent and Trademark Office*